(12) United States Patent
Kirk et al.

(10) Patent No.: US 7,870,408 B2
(45) Date of Patent: Jan. 11, 2011

(54) UNIVERSAL SERIAL BUS WAKEUP CIRCUIT

(75) Inventors: Charles Ray Kirk, Raleigh, NC (US); John David Landers, Jr., Raleigh, NC (US); David John Steiner, Raleigh, NC (US); Paul Morton Wilson, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 11/955,153

(22) Filed: Dec. 12, 2007

(65) Prior Publication Data

US 2009/0153189 A1 Jun. 18, 2009

(51) Int. Cl.
*G06F 1/32* (2006.01)

(52) U.S. Cl. .................. 713/323; 713/324; 713/340

(58) Field of Classification Search ............ 713/323, 713/324, 340
See application file for complete search history.

(56) References Cited

U.S. PATENT DOCUMENTS

| 6,230,277 | B1 * | 5/2001 | Nakaoka et al. ............ 713/320 |
| 6,367,024 | B1 * | 4/2002 | Ezell ........................ 713/340 |
| 6,467,042 | B1 * | 10/2002 | Wright et al. ............... 713/320 |
| 6,622,178 | B1 | 9/2003 | Burke et al. |
| 6,665,801 | B1 | 12/2003 | Weiss |
| 6,708,278 | B2 * | 3/2004 | Howard et al. .............. 713/323 |
| 6,782,491 | B1 | 8/2004 | Foedlmeier et al. |
| 7,176,902 | B2 | 2/2007 | Peterson, Jr. et al. |
| 7,711,970 | B2 * | 5/2010 | Keller ........................ 713/323 |
| 2007/0130479 | A1 | 6/2007 | Price et al. |

\* cited by examiner

*Primary Examiner*—Thuan N Du
(74) *Attorney, Agent, or Firm*—Yee & Associates, P.C.; Tom Tyson

(57) ABSTRACT

A circuit is attached in parallel to a universal serial bus interface of a data processing system. A capacitor in the circuit is charged by receiving power from a power pin of the universal serial bus interface while the data processing system is not in a reduced power state. A vibration sensor is unpowered while the data processing system is not in a reduced power state. The vibration sensor is disconnected from a data pin of the universal serial bus interface while the data processing system is not in a reduced power state. When the data processing system enters a reduced power state, the capacitor provides power to the vibration sensor. When a vibration is detected by the vibration sensor, a switch connects the vibration sensor to the data pin of the universal serial bus interface, providing a wake up signal to the data processing system.

20 Claims, 3 Drawing Sheets

UNIVERSAL SERIAL BUS WAKEUP CIRCUIT

BACKGROUND OF THE INVENTION

1. Field of the Invention

The present invention relates generally to computer systems, and more specifically to a computer system having a universal serial bus (USB) interface. In particular, the present invention allows a computer system to be activated in response to activity generated at a universal serial bus peripheral.

2. Description of the Related Art

Universal serial bus has been developed to provide a uniform electrical interface for personal computer system peripherals. As a result, peripherals, such as pointing devices, joysticks, modems, and Local Area Network (LAN) adapters equipped with a universal serial bus interface, have easier connection and lowered interface cost. Currently, up-to-date universal serial bus interfaces are developed in accordance with universal serial bus specification Revision 2.0 as promulgated by universal serial bus Implementers Forum, Inc., an Oregon non-profit corporation formed by a consortium of manufacturers of universal serial bus-related components.

Universal serial bus uses a hub-based interconnect, that provides a star configuration interconnect in order to interface a potentially large number of peripherals to the main processing unit of a computer system. Hubs are used to provide an individual port for each peripheral or to provide a port for connection to another hub. Power and data signaling are incorporated within a single cable, making peripheral interfaces so convenient that wall adapters for low-power peripherals may be eliminated, and a single cable connection can be made.

Present-day computer systems provide power management to conserve power and reduce heat generated by a computer system when system activity is not required. A computer system may be set to a totally shutdown state, or may be placed in various modes known as "suspend" or "resume", among other terms of art used to describe an operating mode in which a portion of the computer system is active waiting on a stimulus to resume full system operation. Examples of stimuli that can be detected for resuming operations are mouse movement, modem dial-in, and LAN activity.

The universal serial bus specification provides a power management feature whereby a connected universal serial bus peripheral may wake up a host computer system using a resume signaling protocol. This power management feature may only be used while universal serial bus peripheral devices are placed in a suspended mode. Since the suspended mode must be initialized by the universal serial bus software components provided by the operating system, the universal serial bus peripheral device must be connected and the operating system must be executing on the host system prior to the use of the universal serial bus peripheral to wake up the system. Thus, the wake-up feature typically cannot be used with an uninitialized device that has not been connected to the host system prior to the host system entering the suspend state. Additionally, the resume signaling mechanism provides only a simple on/off signaling with no security provision for controlling power management access.

Therefore, it would be desirable to provide an improved method and apparatus for activating a computer system in response to a stimulus from a universal serial bus peripheral.

BRIEF SUMMARY OF THE INVENTION

A circuit is attached in parallel to a universal serial bus interface of a data processing system. A capacitor in the circuit is charged by receiving power from a power pin of the universal serial bus interface while the data processing system is not in a reduced power state. A vibration sensor is unpowered while the data processing system is not in a reduced power state. The vibration sensor is disconnected from a data pin of the universal serial bus interface while the data processing system is not in a reduced power state. When the data processing system enters a reduced power state, the capacitor provides power to the vibration sensor. When a vibration is detected by the vibration sensor, a switch connects the vibration sensor to the data pin of the universal serial bus interface, providing a wake up signal to the data processing system.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE INVENTION universal serial bus implemented power saving methods are desirable to help reduce costs associated with leaving data processing systems in a powered on configuration for extended time periods. However, previously implemented universal serial bus devices require the maintenance of a reduced current to the universal serial bus device in order to generate a "wake-up" signal. Thus, previous devices have been unable to completely power off, and thus must be maintained in a reduced power state.

The illustrative embodiments solve the problems in the current art by providing a capacitor within the universal serial bus device, capable of producing the voltage necessary to generate a "wake-up" signal from the connected universal serial bus device. Voltage provided to the universal serial bus device from the data processing system is used to charge the capacitor during a period of normal or non-powered-down operation.

When the universal serial bus device enters a powered-down configuration, power is directed from the capacitor to a vibration sensor. When a vibration is detected, the vibration sensor toggles a switch, sending voltage being stored in the capacitor to a universal serial bus input of the universal serial bus interface. The voltage provided to the universal serial bus input provides at least a 3.3V for 2.5 microseconds to either of the D+ or D− signals in order to cause the motherboard universal serial bus logic to wake up the rest of the system.

Once the terminals wake up, the presence of a voltage through the universal serial bus device disables the switch such that the capacitor begins to recharge. While in a powered up state, the circuitry of the implemented embodiments is effectively invisible to the host.

Using the illustrative embodiments described herein, a universal serial bus device can be completely powered off, such that no external voltage is required to the universal serial bus device in order to detect a "wake-up" signal. No external power is required to operate the circuit. The circuit can be attached in parallel with an existing universal serial bus device. Similarly, the circuit is physically small enough that it can be implemented in the shell of a cable connector.

Figure 1:
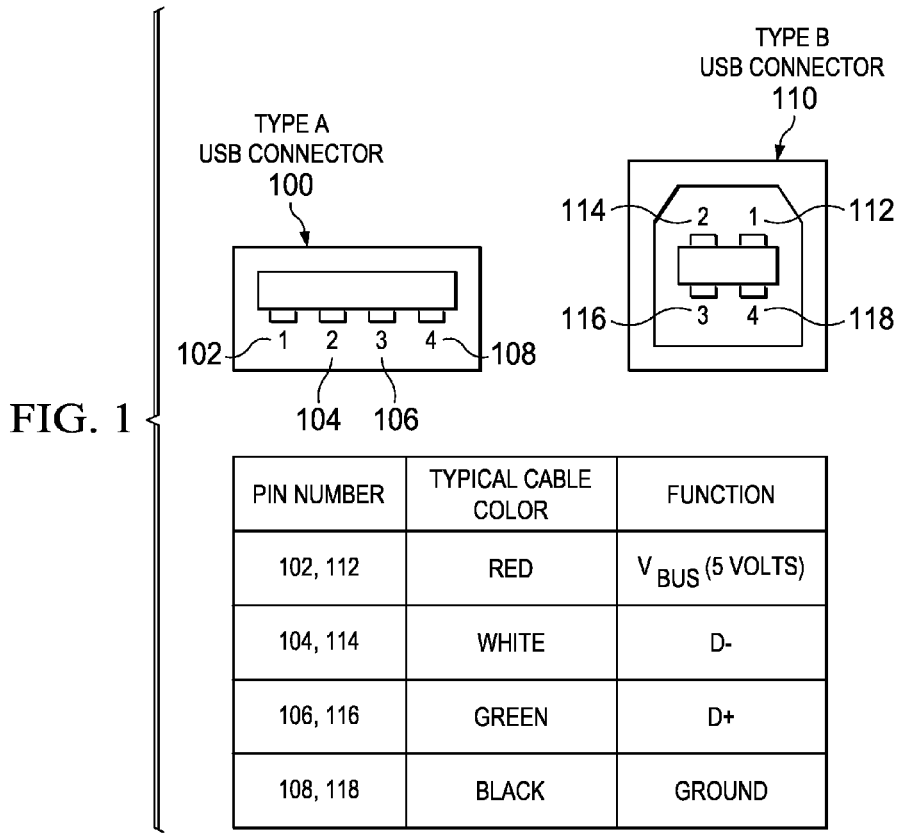
FIG. 1 are known universal serial bus connectors.

Referring now to FIG. 1, known universal serial bus connectors are shown. Specifically, Type A universal serial bus connector 100 and Type B universal serial bus connector 110 provide connections for a universal serial bus device to be connected to a data processing system, as is known in the art.

Type A universal serial bus connector 100 and Type B universal serial bus connector 110 are serial buses utilizing four shielded wires. One of the wires provides a low voltage power source from the host. One of the wires is a ground. The remaining two wires provide twisted pair differential data signals. The four wires are housed along a universal serial bus cable having an upstream connection, Type A universal serial bus connector 100, and a downstream connection, Type B universal serial bus connector 110. The upstream connection connects to the host, while the downstream connection connects to the device.

Power pins 102, 112 provide power to downstream devices. The universal serial bus specification provides a V (volts) supply on a single wire from which connected universal serial bus devices may draw power. The specification provides for no more than 5.25 V and no less than 4.75 V (5 V±5%) between the positive and negative bus power lines. Initially, a device is only allowed to draw 100 mA. It may request more current from the upstream device in units of 2 mA up to a maximum of 500 mA. Ground pins 108, 118 provide a ground.

Data pins 104, 114 and data pins 106, 116, are labeled D+ and D− respectively, and are a twisted pair of data cables used to transmit the universal serial bus signal. The twisted pair data cable operates with 90 ohms ±15 percent impedance. These twisted pair data cables collectively use half-duplex differential signaling to combat the effects of electromagnetic noise on longer lines. D+ and D− usually operate together; however they are not separate simplex connections. Transmitted signal levels are 0.0-0.3 volts for low and 2.8-3.6 volts for high in Full Speed and Low Speed modes, and +−400 mV in High Speed (HS) mode.

Figure 2:
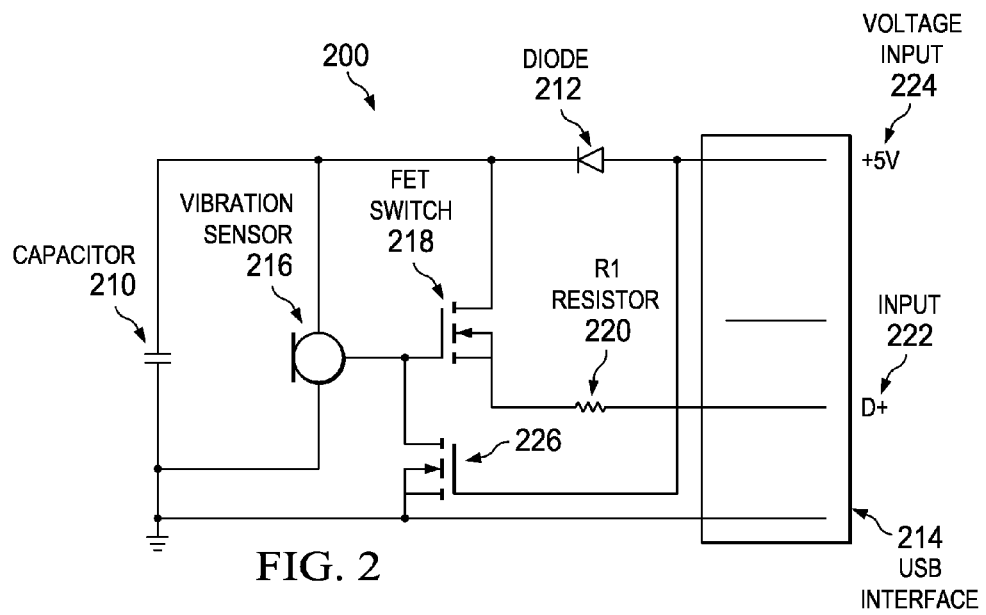
FIG. 2 is a circuit diagram of a no-power wake up circuit in accordance with an illustrative embodiment.

Referring now to FIG. 2, a circuit diagram of a no-power wake up circuit is shown in accordance with an illustrative embodiment. Circuit 200 of FIG. 2 can be attached in parallel with an existing universal serial bus device at a universal serial bus connector, such as Type A universal serial bus connector 100 and Type B universal serial bus connector 110 of FIG. 1.

Capacitor 210 is charged through diode 212 when universal serial bus interface 214 is provided power from an attached data processing system. The presence of power through universal serial bus interface 214 also disables the output of vibration sensor 216.

When the data processing system enters a reduced power state, power is no longer supplied through universal serial bus interface 214. A reduced power state is a shutdown state, hibernation state, or other state of reduced or removed power within the data processing system. Responsive to the absence of power in universal serial bus interface 214, vibration sensor 216 is powered from the charge contained in capacitor 210. When a vibration or impact is detected by vibration sensor 216, vibration sensor 216 turns on field effect transistor switch 218. Field effect transistor switch 218 then connects 1.5K R1 resistor 220 to the voltage being stored in capacitor 210. The voltage is thus routed through R1 resistor 220, pulling up D+universal serial bus input 222 of universal serial bus interface 214.

Universal serial bus standard indicates that providing either the D+ or D− signals can receive a wake up signal of 3.3 volt signal for 2.5 microseconds in order to cause the motherboard universal serial bus logic to wake up the rest of the system. The wake up signal is a voltage applied that is sufficient to cause the motherboard universal serial bus logic to wake up the rest of the system. Thus, the voltage in capacitor 210 should provide a wake up signal of at least 3.3V for 2.5 microseconds to the D+ signal in order to cause the motherboard universal serial bus logic to wake up the rest of the system.

Once the data processing system wakes up, that is at least 3.3V is supplied to the D+ signal for at least 2.5 microseconds causing the data processing system to exit the reduced power state, the data processing system again applies the +5V in voltage input 224. The presence of +5V in voltage input 224 of universal serial bus interface 214 disables, via switch Q2 226, the connection of the 1.5K resistor, removes the device from the universal serial bus network, and again starts capacitor 210's charging process. At this point, the circuitry is effectively invisible to the host data processing system.

While there is a finite lifetime before the capacitor charge bleeds off, the bleed off time is on the order of several hours or days. The bleed off time is therefore typically far longer than ever needed in a typical suspend/resume type of environment.

Figure 3:
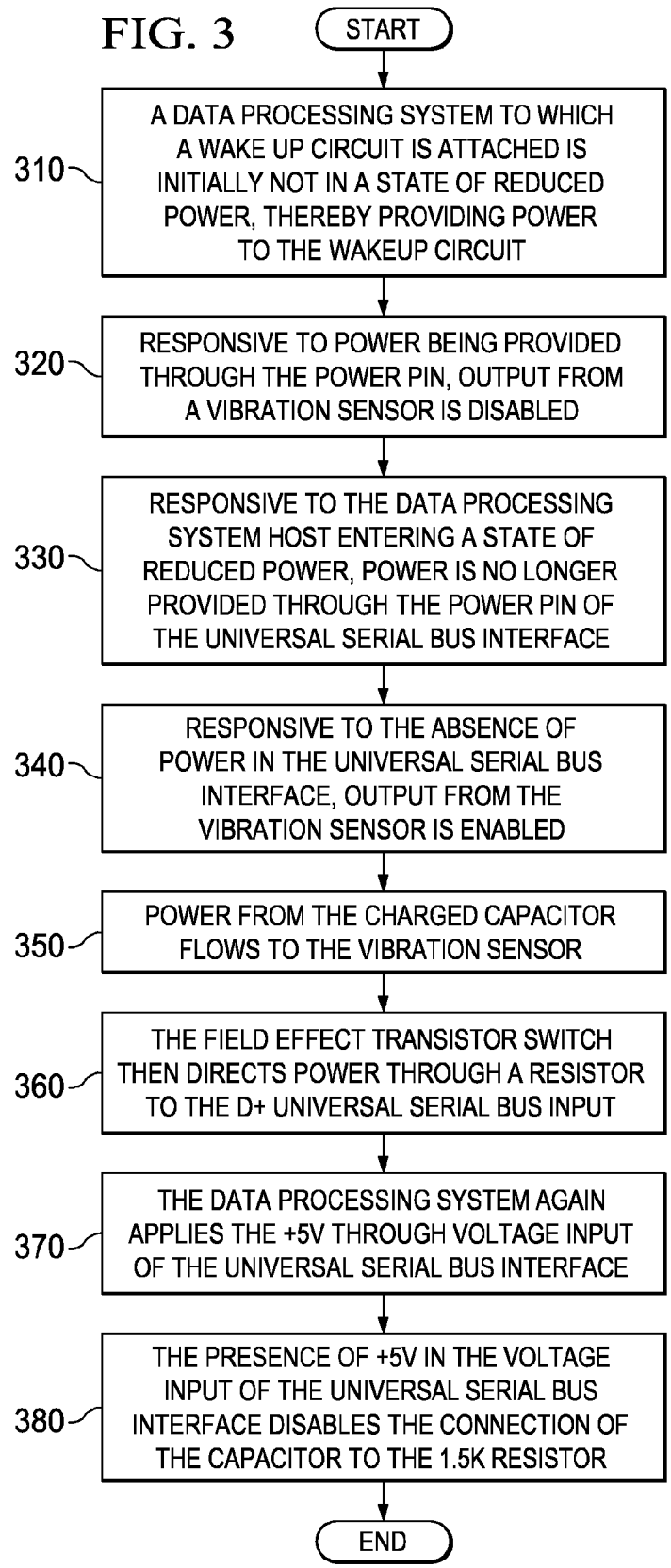
FIG. 3 is a flowchart illustrating the flow of power through the no-power wake up circuit in accordance with an illustrative embodiment.

Referring now to FIG. 3, a flowchart illustrating the flow of power through the no-power wake up circuit is shown in accordance with an illustrative embodiment. The flowchart of FIG. 3 illustrating the flow of power through the components of the no-power wake up circuit of FIG. 2.

A data processing system to which a wake up circuit is attached is initially not in a state of reduced power, thereby providing power to the wakeup circuit (step 310). Power is provided to the wakeup circuit through a power pin, such as power pins 102, 112 of FIG. 1, or of a universal serial bus interface, such as universal serial bus interface 214 of FIG. 2. Power from the power pin is directed through a diode, such as diode 212 of FIG. 2, to charge a capacitor, such as capacitor 210 of FIG. 2. Responsive to power being provided through the power pin, output from a vibration sensor, such as vibration sensor 216 of FIG. 2, is disabled (step 320).

Responsive to the data processing system host entering a state of reduced power, power is no longer provided through the power pin of the universal serial bus interface (step 330). Responsive to the absence of power in the universal serial bus interface, output from the vibration sensor is enabled (step 340), and power from the charged capacitor flows to the vibration sensor (step 350).

Responsive to a vibration or impact is detected by the vibration sensor, the vibration sensor turns on a field effect transistor switch (step 350), such as field effect transistor switch 218 of FIG. 2. The field effect transistor switch then directs power through a resistor, such as 1.5K R1 resistor 220 of FIG. 2, to the D+ universal serial bus input (step 360), such as universal serial bus input 222 of FIG. 2. Voltage being stored in the capacitor is thus routed through the resistor, pulling up the D+ universal serial bus input of the universal serial bus interface.

Universal serial bus standard indicates that providing either the D+ or D− signals can receive a wake up signal of 3.3 volt signal for 2.5 microseconds in order to cause the motherboard universal serial bus logic to wake up the rest of the system. The wake up signal is a voltage applied that is sufficient to cause the motherboard universal serial bus logic to wake up the rest of the system. Thus, the voltage in the capacitor should provide a wake up signal of at least 3.3V for 2.5 microseconds to the D+ signal in order to cause the motherboard universal serial bus logic to wake up the rest of the data processing system.

Once the data processing system wakes up, that is at least 3.3V is supplied to the D+ signal for at least 2.5 microseconds causing the data processing system to exit the reduced power state, the data processing system again applies the +5V through voltage input, such as voltage input 224 of FIG. 2, of the universal serial bus interface (step 370). The presence of +5V in the voltage input of the universal serial bus interface disables, via a second field effect transistor switch, such as switch Q2 226 of FIG. 2, the connection of the capacitor to the 1.5K resistor (step 380). This disabling removes the wake up circuit from the universal serial bus network, and again starts the capacitor charging process (step 390), with the process terminating thereafter. At this point, the wake up circuit is effectively invisible to the host data processing system.

Figure 4:
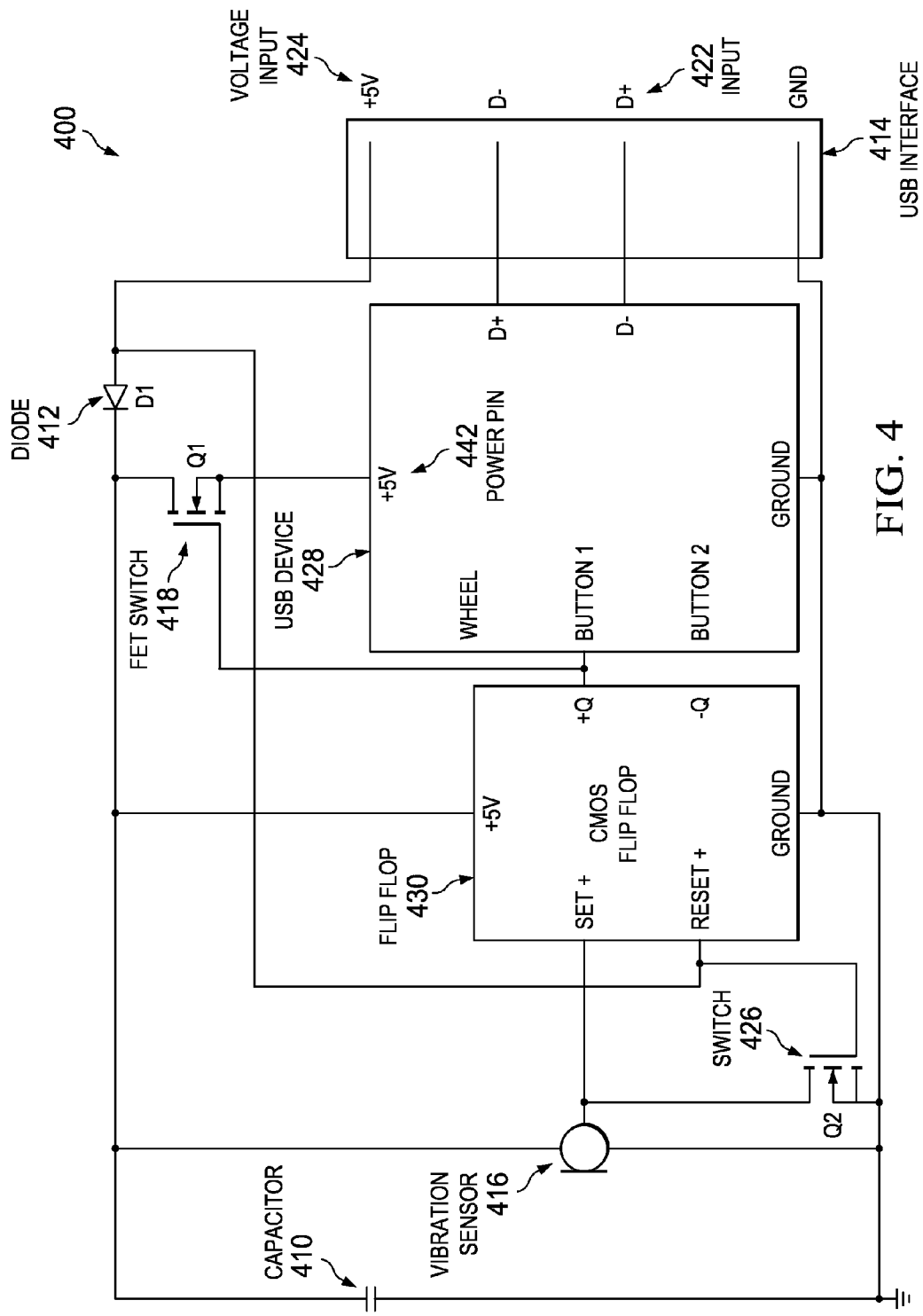
FIG. 4 is a circuit diagram of an alternative no-power wake up circuit in accordance with the illustrative embodiments.

Referring now to FIG. 4, a circuit diagram of an alternative no-power wake up circuit is shown in accordance with the illustrative embodiments. The circuit of FIG. 4 has an attached universal serial bus peripheral device that is fully capable of implementing the entire universal serial bus communications protocol. While the attached peripheral device is indicated as a universal serial bus mouse, any universal serial bus peripheral device can be utilized. The circuit of FIG. 4 can be attached in parallel with an existing universal serial bus device at a universal serial bus connector, such as Type A universal serial bus connector 100 and Type B universal serial bus connector 110 of FIG. 1.

Capacitor 410 is charged with current flowing from diode 412 when universal serial bus interface 414 is provided power from an attached data processing system. The presence of power through universal serial bus interface 414 also disables the output of vibration sensor 416. The presence of power through universal serial bus interface 414 also disables power from capacitor 410 to the universal serial bus device 428 and inhibits vibration detection from vibration sensor 416.

When the data processing system enters a no-power shutdown state, hibernation state or other state of reduced or removed power, power is no longer supplied through universal serial bus interface 414. Universal serial bus device 428 is disconnected from the supply voltage C1 provided by capacitor 410. Responsive to the absence of power in universal serial bus interface 414, vibration sensor 416 is powered from the charge contained in capacitor 410.

When a vibration/impact is detected by vibration sensor 416, flip flop 440 is latched on, which turns on field effect transistor switch 418. By switching field effect transistor switch 418 on, power pin 442 of universal serial bus device 428 is connected to the voltage supplied by capacitor 410. The supplied voltage from capacitor 410 is thus routed to the universal serial bus device 428, pulling up D+ universal serial bus input 422 of universal serial bus interface 414.

Universal serial bus standards indicate that either the D+ or D− signals need to be pulled above 3.3V for 2.5 microseconds in order to cause the motherboard universal serial bus logic to wake up the rest of the system. Thus, the voltage in capacitor 410 should provide at least 4.4V for 2.5 microseconds to the D+ signal in order to cause the motherboard universal serial bus logic to wake up the rest of the system.

Once the terminal wakes up, the presence of +5V in voltage input 424 of universal serial bus interface 414 disables, via switch Q2 426, the connection of the 1.5K resistor, removes the device from the universal serial bus network, and again starts capacitor 410's charging process. Once 5V is available from the host indicating that wakeup is complete, flip flop 440 is reset, disabling power from capacitor 410 to universal serial bus device 428 and inhibiting further vibration detections by vibration sensor 416.

While there is a finite period of time before the capacitor charge discharges or dissipates, the discharge time is on the order of several hours or days. The discharge time is therefore typically far longer than ever needed in a typical suspend/resume type of environment.

Universal serial bus device is capable of producing the voltage necessary to generate a "wake-up" signal from the connected universal serial bus device. Voltage provided to the universal serial bus device from the data processing system is used to charge the capacitor during a period of normal or non-powered-down operation.

When the universal serial bus device enters a powered-down configuration, power is directed from the capacitor to a vibration sensor. When a vibration is detected, the vibration sensor toggles a switch, sending voltage being stored in the capacitor to a universal serial bus input of the universal serial bus interface. The voltage provided to the universal serial bus input provides at least a 3.3V for 2.5 microseconds to either of the D+ or D− signals in order to cause the motherboard universal serial bus logic to wake up the rest of the system.

Once the terminal wakes up, the presence of a voltage through the universal serial bus device disables the switch such that the capacitor begins to recharge. While in a powered up state, the circuitry of the implemented embodiments is effectively invisible to the host.

Using the illustrative embodiments described herein, a universal serial bus device can be completely powered off such that no external voltage is required to operate the universal serial bus device in order to detect a "wake-up" signal. No external power is required to operate the circuit. The circuit can be attached in parallel with an existing universal serial bus device. Similarly, the circuit is physically small enough that it can be implemented in the shell of a cable connector.

The circuit as described above is part of the design for an integrated circuit chip. The chip design is created in a graphical computer programming language, and stored in a computer storage medium, such as a disk, tape, physical hard drive, or virtual hard drive, such as in a storage access network. If the designer does not fabricate chips or the photolithographic masks used to fabricate chips, the designer transmits the resulting design by physical means (e.g., by providing a copy of the storage medium storing the design), or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit comprising:
   a capacitor, wherein the capacitor is charged by receiving power from a power pin of the universal serial bus interface while the data processing system is not in a reduced power state;
   a vibration sensor, wherein the vibration sensor does not receive power while the data processing system is not in the reduced power state, and wherein the vibration sensor is disconnected from a data pin of the universal serial bus interface while the data processing system is not in the reduced power state, wherein the capacitor provides power to the vibration sensor while the data processing system is in the reduced power state;
   a switch, wherein responsive to a vibration detection from the vibration sensor while the data processing system is in the reduced power state, the switch connects the vibration sensor to the data pin of the universal serial bus interface, providing a wake up signal to the data processing system.

2. The circuit of claim 1, further comprising:
   a diode, wherein power from the power pin is directed through the diode to charge the capacitor.

3. The circuit of claim 1, wherein the switch is a first switch and further comprising:
   a second switch, wherein responsive to the data processing system not being in the reduced power state, the second switch disables the connection between the vibration sensor and the data pin, enabling charging of the capacitor.

4. The circuit of claim 1, further comprising:
   a flip flop, wherein responsive to a vibration detection from the vibration sensor while the data processing system is in the reduced power state, the flip flop is latched on, and wherein the switch connecting the vibration sensor to the data pin of the universal serial bus interface is responsive to the flip flop being latched on.

5. The circuit of claim 4, further comprising:
   a diode, wherein power from the power pin is directed through the diode to charge the capacitor.

6. The circuit of claim 4, wherein the switch is a first switch and further comprising:
   a second switch, wherein responsive to the data processing system not being in the reduced power state, the second switch disables the connection between the vibration sensor and the data pin, enabling charging of the capacitor.

7. The circuit of claim 1, wherein the switch is a field effect transistor switch.

8. The circuit of claim 3, wherein both the first switch and the second switch are field effect transistor switches.

9. The circuit of claim 1 further comprising:
   a resistor between the switch and the data pin of the universal serial bus interface, wherein the wake up signal to the data processing system is directed through the resistor prior to the universal serial bus interface.

10. The circuit of claim 9, wherein the resistor is a 1.5K Ohm resistor.

11. A method for providing a wake up signal to a data processing system in a reduced power state, the method comprising:
    charging a capacitor from a power pin of a universal serial bus interface while the data processing system is not in the reduced power state;
    responsive to the data processing system entering the reduced power state, providing power to a vibration sensor from the capacitor, wherein the vibration sensor does not receive power while the data processing system is not in the reduced power state;
    detecting a vibration by the vibration sensor;
    responsive to detecting the vibration, connecting the vibration sensor to a data pin of the universal serial bus interface; and
    responsive to connecting the vibration sensor to the data pin of the universal serial bus interface, providing a wake up signal to the data processing system.

12. The method of claim 11, wherein the step of charging the capacitor further comprises:
    charging a capacitor from a power pin of the universal serial bus interface directed through a diode.

13. The method of claim 11, wherein the step of charging the capacitor further comprises:
    charging the capacitor with a voltage of no more than 5.25 volts.

14. The method of claim 11, wherein the step of providing a wake up signal to the data processing system further comprises:
    providing the wake up signal to the universal serial bus input, wherein the wake up signal is at least a 3.3 volt current provided for at least for 2.5 microseconds to the data pin of the universal serial bus input.

15. The method of claim 11 further comprising:
    responsive to the data processing system not being in the reduced power state, disconnecting the vibration sensor and the data pin; and
    disconnecting the vibration sensor and the data pin, enabling charging of the capacitor.

16. The method of claim 11, further comprising:
    responsive to detecting the vibration from the vibration sensor while the data processing system is in the reduced power state, latching on a flip flop, wherein connecting the vibration sensor to the data pin of the universal serial bus interface is responsive to latching on the flip flop.

17. The method of claim 16, further comprising:
    directing power from the power pin through a diode to charge the capacitor.

18. The method of claim 16, further comprising:
    responsive to the data processing system not being in the reduced power state, disconnecting the vibration sensor and the data pin; and
    responsive to disconnecting the vibration sensor and the data pin, enabling charging of the capacitor.

19. The method of claim 11 further comprising:
    providing a wake up signal to the data processing system, wherein the wake up signal to the data processing system is directed through a resistor prior to the universal serial bus interface, the resistor being between the switch and the data pin of the universal serial bus interface.

20. The method of claim 19, wherein the resistor is a 1.5K Ohm resistor.

* * * * *